(12) United States Patent
Duffy

(10) Patent No.: US 11,652,498 B2
(45) Date of Patent: May 16, 2023

(54) ITERATIVE BIT FLIP DECODING BASED ON SYMBOL RELIABILITIES

(71) Applicant: National University of Ireland Maynooth, Maynooth (IE)

(72) Inventor: Kenneth R. Duffy, Dublin (IE)

(73) Assignee: National University of Ireland, Maynooth, Maynooth (IE)

(*) Notice: Subject to any disclaimer, the term of this patent is extended or adjusted under 35 U.S.C. 154(b) by 0 days.

(21) Appl. No.: 17/636,587

(22) PCT Filed: Oct. 21, 2020

(86) PCT No.: PCT/EP2020/079671
§ 371 (c)(1),
(2) Date: Feb. 18, 2022

(87) PCT Pub. No.: WO2021/115670
PCT Pub. Date: Jun. 17, 2021

(65) Prior Publication Data

US 2022/0302931 A1    Sep. 22, 2022

(30) Foreign Application Priority Data

Dec. 11, 2019 (GB) .................................. 1918218

(51) Int. Cl.
*H03M 13/37* (2006.01)
*H03M 13/11* (2006.01)
(Continued)

(52) U.S. Cl.
CPC ... *H03M 13/3746* (2013.01); *H03M 13/1108* (2013.01); *H03M 13/451* (2013.01); *H03M 13/6325* (2013.01)

(58) Field of Classification Search
CPC ......... H03M 13/3746; H03M 13/1108; H03M 13/451; H03M 13/6325; H03M 13/37; H03M 13/45
See application file for complete search history.

(56) References Cited

U.S. PATENT DOCUMENTS 6,138,264 A    10/2000   Nava et al.
6,511,280 B1   1/2003    Sammartino et al.
(Continued)

FOREIGN PATENT DOCUMENTS

EP         1819058         8/2007
WO    WO 2021/115670 A1    6/2021

OTHER PUBLICATIONS

International Search Report and Written Opinion for International Patent Application No. PCT/EP2020/079671 dated Jan. 18, 2021; 20 Pages.

(Continued)

*Primary Examiner* — Thien Nguyen
(74) *Attorney, Agent, or Firm* — Daly, Crowley, Mofford & Durkee LLP

(57) ABSTRACT

The present application concerns an iterative bit-flipping decoding method using symbol or bit reliabilities, which is a variation of GRAND decoding and is denoted by ordered reliability bits GRAND (ORBGRAND). It comprises receiving a plurality of demodulated symbols from a noisy transmission channel; and receiving for the plurality of demodulated symbols, information indicating a ranked order of reliability of at least the most unreliable information contained within the plurality of demodulated symbols. A sequence of putative noise patterns from a most likely pattern of noise affecting the plurality of symbols through one or more successively less likely noise patterns is provided. Responsive to the information contained within the plurality of symbols not corresponding with an element of a (Continued)

code-book comprising a set of valid codewords, a first in the sequence of putative noise patterns is used to invert the most unreliable information of the information contained within the plurality of symbols to obtain a potential codeword, and responsive to the potential codeword not corresponding with an element of the code-book, repeatedly: a next likely noise pattern from the sequence of putative noise patterns is applied to invert a noise effect on the received plurality of demodulated symbols to provide a potential codeword, each successive noise pattern indicating an inversion of information for one or more demodulated symbols for a next more reliable combination of information contained within the plurality of symbols, until the potential codeword corresponds with an element of the code-book.

7 Claims, 2 Drawing Sheets

(51) Int. Cl.
*H03M 13/45* (2006.01)
*H03M 13/00* (2006.01)

(56) References Cited

U.S. PATENT DOCUMENTS

| | | | |
|---|---|---|---|
| 6,625,226 | B1 | 9/2003 | Gersho et al. |
| 7,209,867 | B2 | 4/2007 | Vigoda et al. |
| 7,860,687 | B2 | 12/2010 | Vigoda et al. |
| 8,335,484 | B1* | 12/2012 | Arad .................. H04B 1/0003 455/67.11 |
| 8,851,382 | B2 | 10/2014 | Powers et al. |
| 9,246,156 | B2 | 1/2016 | Kwag et al. |
| 9,432,059 | B1 | 8/2016 | Sakamoto |
| 9,769,003 | B2 | 9/2017 | Bogdan |
| 9,998,148 | B2 | 6/2018 | Lin et al. |
| 10,311,243 | B2 | 6/2019 | Calmon et al. |
| 10,491,432 | B1 | 11/2019 | Medra et al. |
| 10,608,672 | B2 | 3/2020 | Medard et al. |
| 10,608,673 | B2 | 3/2020 | Medard et al. |
| 10,944,610 | B2 | 3/2021 | Medard et al. |
| 11,095,314 | B2 | 8/2021 | Medard et al. |
| 11,431,368 | B2 | 8/2022 | Medard et al. |
| 11,451,247 | B2 | 9/2022 | Medard et al. |
| 2002/0046382 | A1 | 4/2002 | Yang |
| 2002/0154716 | A1 | 10/2002 | Erving et al. |
| 2002/0161560 | A1 | 10/2002 | Abe et al. |
| 2003/0186659 | A1 | 10/2003 | Kolze |
| 2004/0264555 | A1 | 12/2004 | Hedge et al. |
| 2005/0281348 | A1 | 12/2005 | Kim |
| 2006/0070256 | A1 | 4/2006 | Weissman et al. |
| 2006/0070257 | A1 | 4/2006 | Weissman et al. |
| 2006/0123277 | A1 | 6/2006 | Hocevar |
| 2006/0224307 | A1 | 10/2006 | Schmidt et al. |
| 2007/0011568 | A1 | 1/2007 | Hocevar |
| 2007/0041458 | A1 | 2/2007 | Hocevar et al. |
| 2007/0086539 | A1 | 4/2007 | Hocevar |
| 2008/0075206 | A1 | 3/2008 | Ordentlich et al. |
| 2009/0249159 | A1 | 10/2009 | Lee et al. |
| 2010/0074319 | A1 | 3/2010 | Tseng et al. |
| 2010/0223534 | A1 | 9/2010 | Earnshaw et al. |
| 2011/0072330 | A1 | 3/2011 | Kolze |
| 2014/0146969 | A1 | 5/2014 | Sadot et al. |
| 2015/0236726 | A1 | 8/2015 | Sankaranarayanan et al. |
| 2016/0329978 | A1 | 11/2016 | Zukunft et al. |
| 2017/0134193 | A1 | 5/2017 | Sugihara |
| 2017/0373910 | A1 | 12/2017 | Shahmohammadian et al. |
| 2018/0226999 | A1 | 8/2018 | Wang et al. |
| 2018/0254882 | A1 | 9/2018 | Bogdan |
| 2019/0116560 | A1 | 4/2019 | Naderializadeh et al. |
| 2019/0199473 | A1 | 6/2019 | Medard et al. |
| 2019/0260441 | A1 | 8/2019 | Akuon et al. |
| 2020/0106506 | A1 | 4/2020 | Bhamidipati et al. |
| 2021/0288685 | A1 | 9/2021 | Medard et al. |
| 2021/0384918 | A1 | 12/2021 | Solomon et al. |
| 2022/0014214 | A1 | 1/2022 | Medard et al. |
| 2022/0376725 | A1 | 11/2022 | Medard et al. |

OTHER PUBLICATIONS

U.S. Non-Final Office Action dated Aug. 14, 2019 for U.S. Appl. No. 16/026,811; 9 Pages.
Response to Non-Final Office Action dated Aug. 14, 2019 for U.S. Appl. No. 16/026,811, filed Oct. 4, 2019; 5 Pages.
Notice of Allowance dated Dec. 17, 2019 for U.S. Appl. No. 16/026,811; 7 pages.
U.S. Non-Final Office Action dated Oct. 28, 2019 for U.S. Appl. No. 16/026,822; 6 pages.
Response to Non-Final Office Action dated Oct. 28, 2019 for U.S. Appl. No. 16/026,822, filed Nov. 7, 2019; 2 pages.
Notice of Allowance dated Dec. 4, 2019 for U.S. Appl. No. 16/026,822; 5 pages.
U.S. Non-Final Office Action dated Oct. 29, 2020 for U.S. Appl. No. 16/765,083; 12 Pages.
Response to Non-Final Office Action dated Oct. 29, 2020 for U.S. Appl. No. 16/765,083, filed Dec. 1, 2020; 7 Pages.
Notice of Allowance dated Dec. 11, 2020 for U.S. Appl. No. 16/765,083; 13 Pages.
U.S. Non-Final Office Action dated Feb. 4, 2021 for U.S. Appl. No. 16/793,224; 20 Pages.
Response to U.S. Non-Final Office Action dated Feb. 4, 2021 for U.S. Appl. No. 16/793,224; Response filed on Mar. 31, 2021; 7 Pages.
Notice of Allowance dated Apr. 12, 2021 for U.S. Appl. No. 16/793,224; 8 Pages.
Preliminary Amendment dated Oct. 20, 2021 for U.S. Appl. No. 17/731,925; 5 Pages.
Communication Pursuant to Rules 161(1) and 162 EPC for European Application No. 18834223.2 dated Jul. 29, 2020; 3 Pages.
Response (with amended claims and descriptions) to Communication Pursuant to Rules 161(1) and 162 EPC for European Application No. 18834223.2 dated Jul. 29, 2020; Response filed on Oct. 23, 2020; 22 Pages.
Communication Under Rule 71(3) EPC Intention to Grant for European Application No. 18834223.2 dated Oct. 5, 2021; 7 Pages.
PCT International Search Report dated Apr. 4, 2019, for Application No. PCT/US2018/066810; 5 Pages.
PCT Written Opinion of the International Searching Authority dated Apr. 4, 2019, for Application No. PCT/US2018/066810; 9 Pages.
International Preliminary Report on Patentability dated Jul. 2, 2020 for International Application No. PCT/US2018/066810; 8 Pages.
International Preliminary Report on Patentability dated Jul. 2, 2020 for International Application No. PCT/US2018/066813; 8 Pages.
PCT International Search Report dated Apr. 4, 2019, for Application No. PCT/US2018/066813; 5 Pages.
PCT Written Opinion of the International Searching Authority dated Apr. 4, 2019, for Application No. PCT/US2018/066813; 9 Pages.
Abou-Faycal, et al.; "Binary Adaptive Coded Pilot Symbol Assisted Modulation Over Rayleigh Fading Channels Without Feedback"; IEEE Transactions on Communications; vol. 53; No. 6; pp. 1036-1046; Jun. 2005; 11 Pages.
Akin, et al.; " Training Optimization for Gauss-Markov Rayleigh Fading Channels"; IEEE Communication Society; pp. 5999-6004; Jan. 2007; 6 Pages.
Anderson, et al.; "Optimal Filtering"; IEEE Transactions on Systems, Man, and Cybernetics; vol. SMC-12; No. 2; pp. 235-236; Mar./Apr. 1982; 2 Pages.
Arikan; "Channel Polarization: A Method for Constructing Capacity-Achieving Codes"; ISIT 2008; pp. 1173-1177; Jul. 6-11, 2008; 5 Pages.
Azar, et al.; "On the Equivalence Between Maximum Likelihood and Minimum Distance Decoding Binary Contagion and Queue-Based Channels with Memory;" IEEE Transactions on Communication; vol. 63; No. 1; Jan. 2011; 10 pages.

(56) References Cited

OTHER PUBLICATIONS

Campos; "Understanding the 5G NR Physical Layer;" Keysight Technologies; Nov. 1, 2017; 111 Pages.
Chase, "A Class of Algorithms for Decoding Block Codes with Channel Measurement Information"; IEEE Transactions on Information Theory, vol. IT-18, No. 1; Jan. 1972; 13 Pages.
Duffy, et al., "Guessing Random Additive Noise Decoding with Symbol Reliability Information (SRGRAND)"; https://arxiv.org/; Nov. 25, 2019; 18 Pages.
Duffy, et al.; "Capacity-Achieving Guessing Random Additive Noise Decoding"; IEEE Transactions on Information Theory; vol. 65; No. 7; pp. 4023-4040; Jul. 2019; 21 Pages.
Duffy; "Ordered Reliability Guessing Random Additive Noise Decoding"; Oct. 4, 2020; 6 Pages.
Duffy, et al.; "Guessing Noise, Not Code-Words"; 2018 IEEE International Symposium on Information Theory (ISIT); Jun. 17-22, 2018; 5 Pages.
ETSI; "5G; NR; Physical Layer Procedures for Control"; 3 GPP TS 38.213 version 15.2.0 Release 15; Jul. 2018; 101 Pages.
Gallager; "A Perspective on Multiaccess Channels"; IEEE Transactions on Information Theory; vol. IT-31; No. 2; Mar. 1985; pp. 124-142; 19 Pages.
Kavcic, et al.; "The Viterbi Algorithm and Markov Noise Memory"; IEEE Transactions on Information Theory; vol. 46; No. 1; pp. 291-301; Jan. 1, 2000; 11 Pages.
Kaye, et al.; "Relationship Between LMS Compensators for Intersymbol Interference in Linear and Nonlinear Modulation Schemes"; IEEE Transactions on Information Theory; pp. 244-246; Mar. 1973; 3 Pages.
Li, et al.; "A Successive Decoding Strategy for Channels with Memory"; IEEE Transactions on Information Theory; vol. 53; Issue 2; Jan. 22, 2007; 5 Pages.
Li, et al.; "Approaching Capacity on Noncoherent Block Fading Channels with Successive Decoding"; IEEE ICC; pp. 1416-1420; Jan. 2006; 5 Pages.
Li, et al.; "Design and Analysis of Successive Decoding with Finite Levels for the Markov Channels"; May 5, 2009; 22 Pages.
Li, et al.; "Successive Decoding for Finite State Markov Modelled Flat Fading Channels"; ISIT 2006; Jul. 9-14, 2006; 5 Pages.
Liang, et al.; "Hardware Efficient and Low-Latency CA-SCL Decoder Based on Distributed Sorting"; Jan. 2016; 6 Pages.
Mani, "Symbol-Level Stochastic Chase Decoding of Reed-Solomon and BCH Code"; IEEE Transactions on Communications, vol. 67, No. 8, Aug. 2019; 12 Pages.
Medard, et al.; "Bandwidth Scaling for Fading Multipath Channels"; IEEE Transactions on Information Theory; vol. 48; No. 4; pp. 840-851; Apr. 2002; 13 Pages.
Narayanan, et al.; "A BCJR-DFE Based Receiver for Achieving Near Capacity Performance on Inter Symbol Interference Channels"; Jan. 2004; 10 Pages.
Nevat, et al.; "Channel Tracking Using Pruning for MIMO-OFDM Systems Over Gaus-Markov Channels"; ICASS; III-196-III-196; Jan. 2007; 4 Pages.
Niu, et al.; "CRC-Aided Decoding of Polar Codes"; IEEE Communications Letters; vol. 16; No. 10; pp. 1668-1671; Oct. 2012; 4 Pages.
Silverman et al.; "Coding for Constant-Data-Rate Systems"; IRE Professional Group on Information Theory, IEEE, vol. 4, No. 4; Sep. 1, 1954; 14 Pages.
Solomon, et al.; Soft- Maximum Likelihood Decoding Using Grand; Jan. 9, 2020; 6 Pages.
Stimming, et al.; "LLR-Based Successive Cancellation List Decoding of Polar Codes"; IEEE Transactions on Signals Processing; vol. 63; No. 19; pp. 5165-5179; Oct. 1, 2015; 15 Pages.
Tai, et al.; "List Decoding of Polar Codes"; 2011 IEEE International Symposium on Information Theory Proceedings; pp. 1-5; Jan. 2011; 5 Pages.
Tillich, Jean-Pierre; "Lecture 8: Polar Codes"; Information Theory; Nov. 18, 2016; 41 Pages.
Yang; "A Road to Future Broadband Wireless Access: MIMO-OFDM-Based Air Interface"; Wireless Communications In China: Technology VS. Markets; IEEE Communications Magazine; pp. 53-60; Jan. 2005; 8 Pages.
International Search Report and Written Opinion dated Jun. 30, 2021 for International Application No. PCT/US21/26412; 8 Pages.
U.S. Request for Continued Examination for U.S. Appl. No. 17/202,860, filed Mar. 8, 2022; 3 Pages.
U.S. Non-Final Office Action dated Mar. 29, 2022 for U.S. Appl. No. 17/202,860; 11 Pages.
Response to U.S. Non-Final Office Action dated Mar. 29, 2022 for U.S. Appl. No. 17/202,860, filed Apr. 28, 2022; 9 Pages.
Notice of Allowance dated May 24, 2022 for U.S. Appl. No. 17/202,860; 9 Pages.
U.S. Notice of Allowance dated Jun. 17, 2022 for U.S. Appl. No. 17/371,925; 21 Pages.
PCT International Preliminary Report on Patentability dated Dec. 22, 2022 for International Application No. PCT/US2021/026412; 6 Pages.
U.S. Non-Final Office Action dated Oct. 31, 2022 for U.S. Appl. No. 17/814,349; 12 Pages.
Valembois, Antoine et al. "An Improved Method to Compute Lists of Binary Vectors that Optimize a Given Weight Function with Application to Soft-Decision Decoding" IEEE Communications Letters, vol. 5, No. 11; Nov. 2001; 3 Pages.
U.S. Non-Final Office Action dated Feb. 2, 2023 for U.S. Appl. No. 17/819,697; 18 Pages.
Response with Terminal Disclaimer to Non-Final Office Action dated Oct. 31, 2022 for U.S. Appl. No. 17/814,349; Response with Terminal Disclaimer filed on Jan. 27, 2023; 5 Pages.

\* cited by examiner

ITERATIVE BIT FLIP DECODING BASED ON SYMBOL RELIABILITIES

CROSS REFERENCE TO RELATED APPLICATIONS

This application claims the benefit of International Patent Application PCT/EP2020/079671 filed in the English language on Oct. 21, 2020, published in the English language as WO 2021/115670, which application claims priority from GB application number 1918218.7, filed on Dec. 11, 2019. These applications are incorporated by reference in their entireties.

FIELD

The present invention relates to a method, in a decoder, of decoding as a codeword a plurality of symbols.

BACKGROUND

K. R. Duffy, J. Li, and M. Medard in "Guessing noise, not code-words," in IEEE Int. Symp. on Inf. Theory, 2018; K. R. Duffy, J. Li and Medard in "Capacity-achieving guessing random additive noise decoding (GRAND)", in IEEE Trans. Inf. Theory, 65 (7), 4023-4040, 2019; K. R. Duffy and M. Medard in "Guessing random additive noise decoding with soft detection symbol reliability information," in IEEE Int. Symp. on Inf. Theory, 2019; and K. R. Duffy, M. Medard and W. An in "Guessing random additive noise decoding with soft detection symbol reliability information (SRGRAND)," arXiv:1902.03796, Tech. Rep., 2019; as well as A. Solomon, K. R. Duffy and M. Medard, "Soft maximum likelihood decoding using GRAND," Tech. Rep., 2019 and US2019/199473 and US2019/199377 disclose a family of techniques for decoding signals by guessing noise.

The disclosures of US2019/199473 and US2019/199377 are herein incorporated by reference.

Of these, the most basic technique, is referred to as GRAND, Guessing Random Additive Noise Decoding. GRAND is suitable for use with any block code construction and can decode any forward error correction/detection block code for example, cyclic redundancy check (CRC) code, requiring only a mechanism by which to query if a string of bits derived from one or more demodulated symbols, each corresponding to one or more bits, received through one or more noisy transmission channels is in a code-book. In GRAND, a decoder takes the string of bits comprising a potential codeword from a demodulating receiver and queries if it is in a code-book. If so, the codeword is used as decoded output. If not, then the most likely non-zero binary noise pattern, as determined by a noise model, is subtracted from the string and a resultant next potential codeword is queried for membership of the code-book. This process, which is inherently parallelizable, proceeds sequentially in increasing order of likelihood of putative noise patterns until a codeword in the code-book is identified, or a query threshold T for the number of code-book queries is exceeded whereupon an error is reported.

GRAND assumes a decoder obtains only hard decision demodulated symbols from a receiver. In that context, GRAND can produce an optimally accurate Maximum Likelihood (ML) decoding, assuming that the noise model being employed and providing the order of putative noise patterns reflects the statistical characteristics for noise in the transmission channel(s).

All variants of GRAND sequentially remove putative noise patterns from the string of bits derived from the demodulated symbols, in order from most likely to least likely based on their noise model and any soft information available to them, querying if what remains is in the code-book.

Where variants of GRAND differ is in their query ordering of putative noise patterns, which is contingent on soft information available to them. Each variant determines its query order or sequence of putative noise patterns as a function of a noise model for the transmission channel(s) in combination with soft information provided by a receiver.

Symbol Reliability GRAND (SRGRAND) avails of the most extremely quantized soft information, where, for each collection of n demodulated hard detection symbols, each symbol comprising one or more bits, one additional bit $b''$ tags the demodulated symbol as being reliably or unreliably received. SRGRAND performs a GRAND-like hard detection decoding, but solely queries bit flips in unreliable symbols. If symbols are correctly marked as reliable, SRGRAND provides a ML decoding assuming memoryless noise impacted the unreliable symbols. This use of binary quantized soft information sees increased decoding accuracy and decreased run-times, but does not fully avail of all information at the receiver.

Soft Grand (SGRAND) uses full soft-information, comprising a real-number for each demodulated symbol, to dynamically maintain a sequence of putative noise patterns that, by design, necessarily contains the next most likely putative noise pattern. After q code-book queries have been made, the sequence contains q noise patterns along with their likelihoods. The next putative noise pattern is the one with the highest likelihood in the sequence. If its subtraction from the received string does not result in an element of the code-book, it is removed from the list and two additional putative noise sequences are introduced. To implement SGRAND, real information per received symbol must be passed by the receiver to the decoder, and the decoder requires memory storage to maintain a dynamically determined adaptive sequence of putative noise patterns, both of which may hinder its implementation in practice.

European patent publication EP 1819058 discloses the use of CRC codes for error correction as well as error detection in a received message that includes N message bits and M Cyclic Redundancy Check (CRC) bits appended thereto. It is determined whether at least one bit error has occurred in the N message bits and M CRC bits of the received message based upon the M CRC bits, and when at least one bit error is determined, then K bits with a lowest quality metric are selected from the N message bits and M CRC bits. The bit error is corrected based upon possible bit error patterns and the selected K bits.

SUMMARY

According to the present invention there is provided a method, in a decoder, of decoding as a codeword a plurality of symbols according to claim 1.

In a further aspect, there is provided a decoder configured to perform the method according to the invention; and a computer program product comprising executable code stored on a computer readable medium which when executed in a decoder is configured to perform the method according to the invention.

In addition to hard decision demodulation information provided by a demodulator, embodiments make use of a code-book independent quantization of soft information: the rank ordering of the reliability of hard information comprising a group of n demodulated symbols, where one or more bits can be extracted from each symbol.

Embodiments use this soft information to sort demodulated information in order of reliability and apply a sequence of noise patterns based on the reliability information starting with the most likely noise pattern until either a codeword is found in a code-book or a query threshold is reached.

One benefit of this approach is that efficient algorithms exist to generate the sequence of noise patterns either on-the-fly or the sequence of noise patterns can be pre-stored as there is universality of their order within a class of rank ordered flip probabilities.

In some embodiments, for a block of n symbols, no more than an additional smallest integer that is larger than $\log_2(n)$ bits of soft information per symbol of hard information needs to be provided to the decoder from a demodulating receiver to signal the rank ordering of the reliability of the hard information.

If an ordered sequence of putative noise patterns is consistent with certain channel noise effects models, the sequence of putative noise patterns will be same for any ranked-order reliability for a sequence of hard information.

Based on this rank ordered reliability information alone, embodiments produce a decoding that has similar accuracy to SGRAND, but with simpler computation and requiring no further channel estimation or noise model.

BRIEF DESCRIPTION OF THE DRAWINGS

Embodiments of the invention will now be described, by way of example, with reference to the accompanying drawings, in which.

DESCRIPTION OF THE EMBODIMENT

Figure 1:
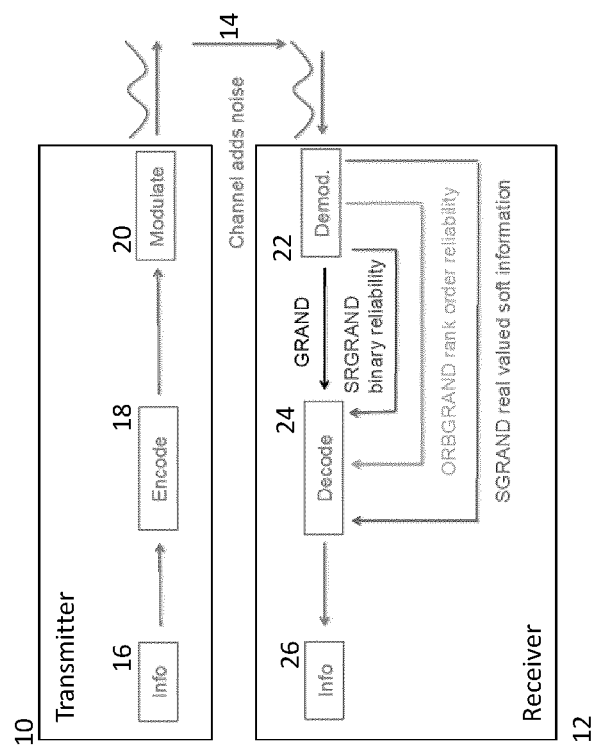
FIG. 1 illustrates a transmitter communicating with a receiver across a noisy transmission channel and showing a demodulator within the receiver providing soft information to a decoder in accordance with variants of GRAND.

Referring now to FIG. 1, there is shown a transmitter 10 and a receiver 12 communicating with one another across a noisy transmission channel 14. The transmitter 10 which can be of a conventional type generates or obtains information 16 which needs to be transmitted. Generally, this is produced by some type of application (not shown) running on the transmitting device 10. Nonetheless, it will be appreciated that the information can be produced by any level of software or hardware executing on the transmitter or on a device coupled to the transmitter. The information is typically serialised and provided to an encoder 18 which can encapsulate the information in any conventional manner, for example, adding redundant information to enable checking or recovery of lost information or encrypting the information, before providing the information to a modulator 20 for transmission across the channel 14.

The channel 14 can be any form of wired or wireless channel which is subject to noisy interference and in some cases, the channel 14 may be divided into a number of sub-channels which carry information in parallel. In any case, it should be appreciated that the channel 14 can comprise any optical, electrical, electro-magnetic or other medium or combination thereof.

The transmitted information is picked up by the receiver 12 coupled to the channel 14, typically through an antenna for wireless electro-magnetic channels, and provided to a demodulator 22. The modulator 20 and demodulator 22 are paired and can be of any form as long as the demodulator 22 is able to produce a stream of symbols from the signal received across the channel 14.

In the embodiment, the stream of symbols is provided to a decoder 24 and again the decoder is configured to reverse the processing performed by the encoder 18 to provide digital information 26 corresponding to the transmitted information 16.

As described above, using GRAND, only the streams of demodulated symbols produced by the demodulator 22 are provided to the decoder 24, for SRGRAND only a binary indication of the reliability or not of any given symbol is provided in addition to the stream of demodulated symbols, whereas for SGRAND, real-valued soft information is provided for each symbol generated by the demodulator 22 in addition to the stream of demodulated symbols.

Part of the decoding process comprises mapping the stream of demodulated symbols into a binary stream of valid information i.e. a string of bits. Each portion of the stream of valid information corresponds to a codeword and once a codeword has been determined from one or more demodulated symbols, this can be processed including decrypting or buffering the information as required before providing the processed information 26.

As will be appreciated, if the transmission channel 14 has been affected by noise, a potential codeword i.e. the string of bits derived from the demodulated symbols provided by the demodulator 22, will not be recognised as a valid codeword in a code-book. (Again, the code-book can be any of a random codebook, a random linear codebook, a Hamming codebook, or a Low Density Parity Check codebook or any form of code-book) Using GRAND, SRGRAND and SGRAND putative noise patterns are removed by the decoder 24 from the string of bits derived from the demodulated symbols and comprising a potential codeword, in order from most likely noise pattern to least likely based on their noise model and any soft information available to them, querying if what remains is in the code-book.

According to one embodiment of the present invention, the decoder 24 uses the hard decision demodulation information provided by the demodulator 22 divided into groups of n demodulated symbols, $y^n$, along with soft information comprising a permutation $r^n$ that indicates the rank ordering of the reliability of an associated group of n demodulated symbols.

The rank ordering indicated by $r^n$ is a code-book independent quantisation of the soft information indicating in order the reliability of each symbol in a group of symbols. As will be appreciated n symbols can have n! permutations for their order of reliability and so $r^n$ requires a word size large enough to encode the particular permutation for a group of symbols.

Where the ordering of permutations is not known a priori by the decoder 24, then where n is a power of 2, $\log_2(n)$ bits of soft information will be required for each symbol. For values of n which are not powers of two, a slightly higher number, the smallest integer that is larger than $\log_2(n)$ bits of soft information, are required for each symbol.

On the other hand, where the ordering of permutations is known by the demodulator 22 and decoder 24 a priori, then $r^n$ need only comprise an index for an algorithm or look-up table which will return the permutation in response to receiving $r^n$ and this can reduce the size of soft information required to no more than $\log_2(n!)/n$ bits of soft information for each symbol, which is smaller than $\log_2(n)$ bits. So, the permutation indicating the rank ordering for a group of 12 demodulated symbols can be encoded in 29 bits, requiring less than 3 bits of soft information per symbol.

Even this assumes that the rank ordering for all symbols of a group of n symbols is employed by the decoder 24. If for example, a decoder was only going to attempt to apply a query threshold T of putative noise patterns based on flipping only the information contained in the most unreliable symbols, then a group of n symbols can be divided into n-a the most unreliable symbols and the remaining a most reliable symbols. Then as will be seen from the example below, only the ranked order of the n-a most unreliable symbols needs to be provided to the decoder as only this information will be required to determine the sequence of up to T noise patterns to apply to a group of demodulated symbols, so reducing the amount of soft information required for a given amount of hard information.

In any case, on receipt of the soft information indicating the permutation $r''$, the decoder 24 is immediately able to determine the ranked order of the reliability of symbols within the associated group of symbols, $y''$. This order enables the decoder to map each symbol in order of its reliability from the most unreliable to the least unreliable (most reliable).

Figure 2:
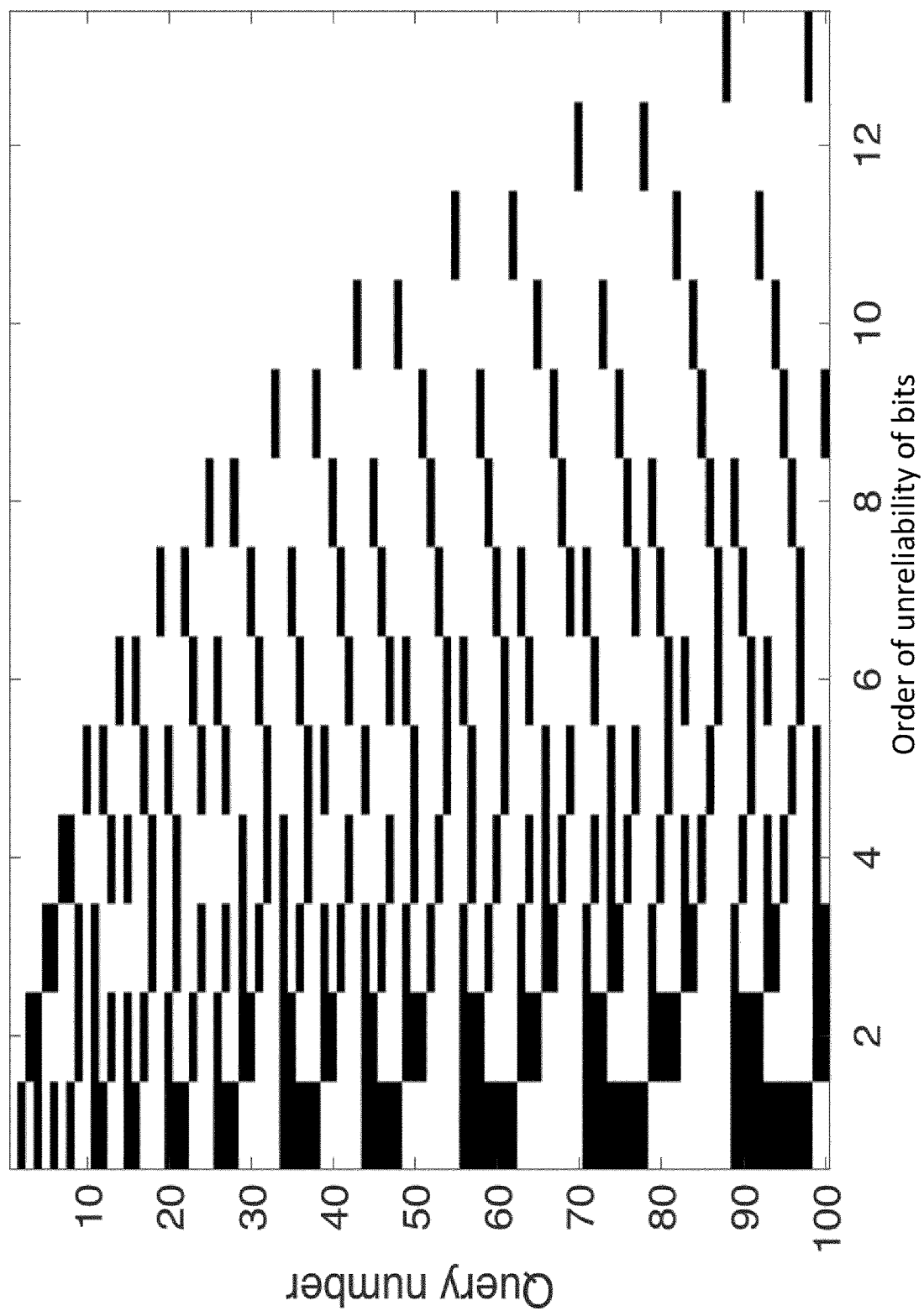
FIG. 2 illustrates an exemplary sequence for putative noise patterns which can be employed within embodiments of the present invention.

Referring now to FIG. 2, which illustrates the first 100 putative noise patterns in an exemplary sequence of noise patterns for a transmission channel 14 affected by white noise, and which can be applied to a sequence of 13 symbols. Each row represents a putative noise pattern with white being "no flip" and black corresponding to flipping the information for a symbol.

For simplicity, the example is described for symbols providing 1 bit of demodulated information. Thus, flipping the information for a symbol simply comprises flipping the demodulated value for a bit between 1 and 0. In other implementations, a symbol can provide z>1 bit of demodulated information. In this case, flipping the information for any given symbol involves a sub-sequence of flipping the demodulated values for all of the bits through their $2^z-1$ remaining combinations (the first combination being assumed to have been tried).

Returning to the example of FIG. 2, the order of the noise patterns is determined by evaluating a cost for flipping information—the cost for flipping information for the least reliable bits being less than the cost for flipping information for more reliable bits. One simple cost function is based on a sum of the rank ordered positions (from 1 to 13 in FIG. 2) of bits to be flipped and comparing those sums. Thus, the most likely putative error sequence is no bit flips, followed by the sequence with only the most likely i.e. unreliable bit being flipped, followed by the sequence with only the second most unreliable bit flipped, followed by a tie, broken arbitrarily, between the sequence with the third most unreliable bit alone flipped and the sequence with first and second most unreliable bits both being flipped, and so forth.

Thus, flipping the bit in position 1 i.e. the least reliable bit in a group of bits, has a lower value than flipping the bit in position 2 i.e. the second least reliable bit in a group of bits, and so this bit is flipped first and the bit in position 2 flipped next.

As explained, using the simple sum criterion, leads to a tie between flipping both the least and second least reliable bits; or flipping just the 3rd least reliable bit. This tie as well as others can be broken arbitrarily so that in the example of FIG. 2, the 3rd noise pattern employed involves flipping the first and second least reliable bits, before then flipping the 3rd least reliable bit, if flipping using the previous noise patterns have not resulted in a valid codeword.

Other noise models may place an additional likelihood penalty or cost on sequences that have more bits flipped and such models could plausibly provide a better approximation for higher quality channels. In this case, the third least reliable bit would be flipped before the combination of first and second bits least reliable bits would be flipped, because this involved fewer flips.

Still further variations of noise model of FIG. 2 are also possible and these can be based on a priori knowledge of the characteristics of a given transmission channel or on characteristics which are learnt, causing the order of the noise patterns within the sequence to change to promote patterns which are more likely to contain a noise pattern (and so cost less to flip) affecting a demodulated group of symbols.

In any case, it will be seen that in contrast to the approach of GRAND and SRGRAND, knowing the ranked order of reliability of demodulated information means that information for more unreliable bits can be flipped before information for more reliable bits is flipped. So, whereas in the example of FIG. 2, information for the most reliable symbol in position 13 is only flipped after more than 80 noise patterns into the sequence, using GRAND or SRGRAND (where all bits were flagged as unreliable), this bit would tend to be flipped after only 13 patterns into a sequence. Similarly, knowing the ranked order of reliability of demodulated information means that information for the two most unreliable bits can be examined by flipping their information with the $3^{rd}$ (or $4^{th}$) noise pattern in a sequence, whereas using GRAND or SRGRAND, this could not happen until only after 13 patterns in a sequence and perhaps the $26^{th}$ pattern.

This improved application of potential noise patterns to demodulated information is possible using embodiments of the invention which need not assume any further information about either the received signal or the channel noise model than the soft information provided by the demodulator 22.

The above embodiment has been described in terms of rank ordering the reliability of symbols within a group of n symbols and flipping bit information for those symbols in accordance with a sequence of noise patterns and the ranked reliability of the symbols.

In variations of the invention, rather than rank order the reliability of demodulated symbols which may correspond with one or more bits of decoded information, the soft information provided from the demodulator 22 can instead rank order demodulated bits directly. Thus, as before, the demodulator 22 needs to pass no more than $\log_2(n)$ bits of code-book independent soft information per demodulated bit to the decoder 24. (Again, for values of n which are not powers of two, a slightly higher number, the smallest integer that is larger than $\log_2(n)$ bits of soft information, are required for each bit.)

The demodulated bits can then be ranked from the most unreliable to the most reliable using the soft information and the sequence of noise patterns, such as shown in FIG. 2 for groups of 13 bits, can be applied to the demodulated bits until a valid codeword is detected.

Again, to reduce the amount of soft information which needs to be passed to the decoder 24 for a group of n bits, techniques such as disclosed above including agreeing the order of possible permutations of the bits or using knowledge of the query threshold T to limit the soft information to the ranked order of only the most unreliable bits can be used.

Again, it will be appreciated that the above described processes lend themselves to parallelization so that for example, a number of decoders can apply a plurality of noise patterns simultaneously to the demodulated symbols provided by the demodulator.

The invention claimed is:

1. A method, in a decoder, of decoding as a codeword a plurality of symbols received from a data sender using a noisy transmission channel, the method comprising:

receiving hard decision demodulation information about a plurality of demodulated symbols from the noisy transmission channel, each symbol corresponding to $z \geq 1$ bits;

receiving for the plurality of demodulated symbols, information indicating a ranked order of reliability of the most unreliable information contained within the plurality of demodulated symbols, wherein said most unreliable information comprises n>1 most unreliable symbols of the plurality of demodulated symbols, wherein when n is equal to a power of 2, said information indicating a ranked order of reliability comprises no more than $\log_2 (n)$ bits per unreliable symbol, and when n is not equal to a power of 2, said information indicating a ranked order of reliability comprises no more than the smallest integer which is larger than $\log_2 (n)$ bits per unreliable symbol;

providing a sequence of putative noise patterns from a most likely pattern of noise affecting said plurality of symbols through one or more successively less likely noise patterns based on the information indicating a ranked order of reliability;

responsive to the information contained within the plurality of symbols not corresponding with an element of a code-book comprising a set of valid codewords, using a first in said sequence of putative noise patterns to invert the most unreliable information of the information contained within the plurality of symbols to obtain a potential codeword;

responsive to the potential codeword not corresponding with an element of the code-book, repeatedly:

applying a next likely noise pattern from the sequence of putative noise patterns to invert a noise effect on the received plurality of demodulated symbols to provide a potential codeword, each successive noise pattern indicating an inversion of information for one or more demodulated symbols for a next more reliable combination of information contained within the plurality of symbols, until the potential codeword corresponds with an element of the code-book; and outputting the potential codeword as the decoded codeword.

2. The method of claim 1 wherein each demodulated symbol provides more than 1 bit of information and where an inversion of information for a demodulated symbol comprises successively inverting the values for each bit for the demodulated symbol to obtain successive potential codewords.

3. The method of claim 1 wherein a sequence of permutations of n pieces of most unreliable information contained within the plurality of demodulated symbols is known a priori and said information indicating a ranked order of reliability comprises no more than $\log_2 (n!)/n$ bits per piece of information.

4. The method of claim 1 where in response to more than one combination of information contained within the plurality of symbols having an equal increase in likelihood, one of said combinations is chosen arbitrarily as the next likely noise pattern.

5. The method of claim 1 wherein said sequence of putative noise patterns include patterns of noise requiring fewer inversions as being more likely.

6. A decoder for decoding as a codeword a plurality of symbols received from a data sender using a noisy data channel, the decoder being configured to perform the method of claim 1.

7. A computer program product comprising executable code stored on a non-transitory computer readable medium which when executed in a decoder is configured to perform the method according to claim 1.

* * * * *